(12) United States Patent
Chang

(10) Patent No.: US 9,297,857 B2
(45) Date of Patent: Mar. 29, 2016

(54) MEMBRANE SWITCH CIRCUIT TESTING SYSTEM

(71) Applicant: Primax Electronics Ltd., Neihu, Taipei (TW)

(72) Inventor: Pei-Ming Chang, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 56 days.

(21) Appl. No.: 14/475,168

(22) Filed: Sep. 2, 2014

(65) Prior Publication Data

US 2015/0331048 A1 Nov. 19, 2015

(30) Foreign Application Priority Data

May 16, 2014 (TW) .............................. 103117351 A

(51) Int. Cl.
*G01R 31/02* (2006.01)
*G01R 31/327* (2006.01)
*G01R 33/36* (2006.01)
*G01R 31/319* (2006.01)

(52) U.S. Cl.
CPC .......... *G01R 31/327* (2013.01); *G01R 33/3628* (2013.01); *G01R 31/31924* (2013.01)

(58) Field of Classification Search
CPC ........... G01R 31/3278; G01R 31/3277; G01R 31/02; G01R 31/3274; G01R 33/3628; G01R 33/3621; G01R 33/3415; G01R 33/3852; G01R 31/2805; G01R 31/024; G01R 31/2812; G01R 31/2884; G01R 31/2853; G01R 31/31924; G01R 31/31922; G01R 31/31937
USPC ........................ 324/415–423, 322, 537, 750.1
See application file for complete search history.

(56) References Cited

U.S. PATENT DOCUMENTS

| | | | | |
|---|---|---|---|---|
| 4,581,603 A * | 4/1986 | Ingold | ................. | H03M 11/003 341/24 |
| 5,081,453 A * | 1/1992 | Endoh | ................. | H03M 11/003 341/22 |
| 5,521,575 A * | 5/1996 | Pack | ..................... | H03M 11/24 341/20 |
| 8,780,048 B2 * | 7/2014 | Li | ......................... | H03M 11/20 345/156 |
| 2011/0078476 A1 * | 3/2011 | Han | ........................ | G06F 1/32 713/320 |
| 2011/0122001 A1 * | 5/2011 | Huang | ................. | G06F 3/0202 341/22 |
| 2011/0309956 A1 * | 12/2011 | Westhues | .............. | H03M 11/20 341/22 |
| 2012/0262376 A1 * | 10/2012 | Li | ........................ | H03M 11/20 345/168 |
| 2014/0077814 A1 * | 3/2014 | Tseng | ................. | G06F 11/2221 324/415 |

* cited by examiner

*Primary Examiner* — Tung X Nguyen
*Assistant Examiner* — Thang Le
(74) *Attorney, Agent, or Firm* — Kirton McConkie; Evan R. Witt

(57) ABSTRACT

A membrane switch circuit testing system includes a testing module and a connection element. After the connection element is connected with a membrane switch circuit and the testing module, the testing module assigns an identification code to a key intersection of the membrane switch circuit. When the key intersection is depressed, an equivalent circuit is defined by the depressed key intersection and a corresponding fixed resistor of the testing module. Moreover, the testing module acquires an intersection resistance value of the depressed key intersection from the equivalent circuit. Consequently, the testing module judges whether the depressed key intersection is qualified according to the intersection resistance value.

10 Claims, 8 Drawing Sheets

FIG.3

MEMBRANE SWITCH CIRCUIT TESTING SYSTEM

FIELD OF THE INVENTION

The present invention relates to a testing system, and more particularly to a membrane switch circuit testing system.

BACKGROUND OF THE INVENTION

With increasing development of science and technology, electronic devices become more and more popular to personal users. The widely-used electronic device includes for example a computer host, a notebook computer, a mobile phone or any other appropriate portable electronic device. Moreover, a peripheral input device may be cooperatively used with the electronic device in order to enhance the operating flexibility of the electronic device. The peripheral input device includes for example a mouse device, a keyboard device or a trackball device.

Generally, a membrane switch circuit has to be installed in the keyboard device. When the membrane switch circuit is pressed by a key of the keyboard device, a corresponding key signal is outputted from the membrane switch circuit. Consequently, the user may input letters, numbers or symbols via the keyboard device. Generally, in the fabrication of the keyboard device, a testing method should be performed to realize whether the functions of the keyboard device are normal or not. The testing method comprises a procedure of testing a circuit board and the membrane switch circuit before the keyboard device is assembled and further comprises a procedure of testing the overall functions of the assembled keyboard device. By testing the circuit board and the membrane switch circuit, the manufacturer may realize whether there is any defect in the circuit board or the membrane switch circuit before the keyboard device is assembled. If the procedures of testing the circuit board and the membrane switch circuit are not done and some defects are found after the keyboard device is assembled, the manufacturer needs to disassemble the keyboard device to debug the circuit board and the membrane switch circuit. It is time-consuming to disassemble the electronic device and debug the circuit board and the membrane switch circuit.

The subject of the present invention is directed to a testing system of a membrane switch circuit. Hereinafter, the structure of a membrane switch circuit will be illustrated with reference to FIG. 1. FIG. 1 is a schematic exploded view illustrating a conventional membrane switch circuit. The conventional membrane switch circuit 1 comprises an upper wiring board 11, a spacer layer 12, and a lower wiring board 13. The upper wiring board 11 has plural first contacts 111 corresponding to plural keys (not shown) of the keyboard device (not shown). The spacer layer 12 is disposed under the upper wiring board 11, and comprises plural perforations 121 corresponding to the plural first contacts 111. The lower wiring board 13 is disposed under the spacer layer 12, and comprises plural second contacts 131 corresponding to the plural first contacts 111. After the upper wiring board 11, the spacer layer 12 and the lower wiring board 13 are combined together, the plural first contacts 111 are disposed over the plural perforations 121, and the plural second contacts 131 are disposed under the plural perforations 121. Each of the plural first contacts 111, the corresponding perforation 121 and the corresponding second contact 131 are collectively defined as a key intersection. The key intersection has an intersection resistance value.

When one of the plural keys is depressed by the user, the first contact 111 of the upper wiring board 11 under the depressed key is pushed and inserted into the corresponding perforation 121, and the first contact 111 is contacted with the corresponding second contact 131. Meanwhile, a corresponding key signal is outputted from the membrane switch circuit 1. When the key is no longer depressed, the first contact 111 and the corresponding second contact 131 are separated from each other, and the first contact 111 and the corresponding second contact 131 are partitioned by the spacer layer 12. Consequently, the first contact 111 and the corresponding second contact 131 are not erroneously connected with each other. However, when the first contact 111 and the corresponding second contact 131 are contacted with each other, if the intersection resistance value is very large, the membrane switch circuit 1 fails to generate the key signal. For solving the above drawbacks, it is necessary to test the key intersections before the keyboard device is assembled.

Generally, an exclusive membrane switch circuit testing fixture and a computer system are employed to test the membrane switch circuit. The testing fixture comprises a resistance meter. Then, all key intersections of the membrane switch circuit may be sequentially pressed by the tester or by using a knocking tool. Consequently, plural intersection resistance values of the plural key intersections are sequentially acquired by the resistance meter. However, the conventional testing method still has some drawbacks. For example, since plural intersection resistance values are transmitted from the resistance meter to the computer system, the tester cannot recognize which intersection resistance values are relevant to specified key intersections. In other words, the sequence of depressing the key intersections has to be recorded or previously arranged by the tester, and then the sequence of depressing the key intersections is correlated with the corresponding intersection resistance values by the tester. Consequently, the tester can recognize which key intersection has the larger intersection resistance value in order to implement associated adjustment.

After the membrane switch circuit is manually tested for a long time, the tester may often erroneously judge the testing result. Under this circumstance, the key intersections are erroneously correlated with the intersection resistance values, and thus the testing accuracy is impaired.

Therefore, there is a need of providing a membrane switch circuit testing system without the manual measurement.

SUMMARY OF THE INVENTION

An object of the present invention provides a cost-effective membrane switch circuit testing system without the manual measurement.

In accordance with an aspect of the present invention, there is provided a membrane switch circuit testing system for testing a membrane switch circuit. The membrane switch circuit includes plural scan input lines, plural scan output lines and plural key intersections. The plural key intersections are defined by the plural scan input lines and the plural scan output lines collaboratively. At least one key intersection of the plural key intersections generates an intersection resistance value when electrically conducted. The membrane switch circuit testing system includes a connection element and a testing module. The connection element is connected with the membrane switch circuit. The testing module is connected with the connection element. The testing module may test the plural intersection resistance values corresponding to the plural key intersections of the membrane switch circuit. The testing module includes a control unit and plural fixed resistors. The control unit has a default resistance value. The control unit recognizes the at least one key intersection, or the control unit judges whether the key intersection is qualified according to the intersection resistance value and the default resistance value. The control unit includes plural first connecting pins corresponding to respective scan input lines and plural second connecting pins corresponding to respective scan output lines. The plural first connecting pins are connected with respective scan input lines. The plural second connecting pins are connected with respective scan output lines. The plural fixed resistors correspond to respective scan input lines, and are connected with respective first connecting pins. When one of the plural key intersections is depressed, an equivalent circuit is defined by the depressed key intersection and the corresponding fixed resistor. The control unit acquires the corresponding intersection resistance value from the equivalent circuit, thereby judging whether the depressed key intersection is qualified.

The above objects and advantages of the present invention will become more readily apparent to those ordinarily skilled in the art after reviewing the following detailed description and accompanying drawings, in which:

BRIEF DESCRIPTION OF THE DRAWINGS

FIG. 3 is a schematic circuit diagram illustrating plural key intersections of the membrane switch circuit to be tested by the membrane switch circuit testing system according to the first embodiment of the present invention;

DETAILED DESCRIPTION OF THE PREFERRED EMBODIMENT

For obviating the drawbacks of the conventional technology, the present invention provides a membrane switch circuit testing system.

Figure 1:
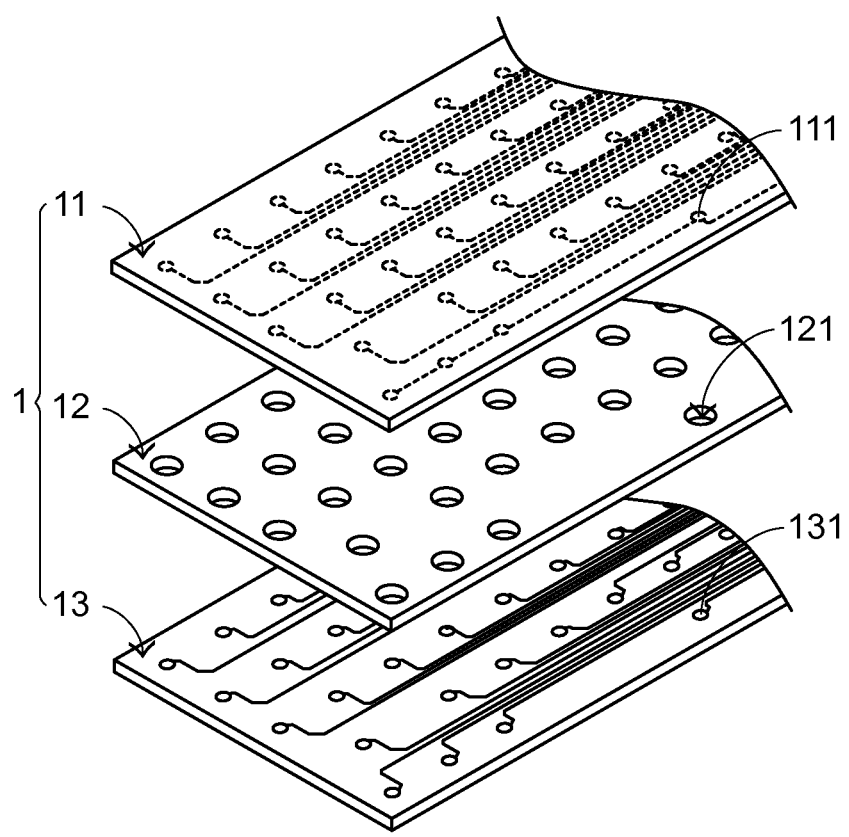
FIG. 1 is a schematic exploded view illustrating a conventional membrane switch circuit.
Figure 2:
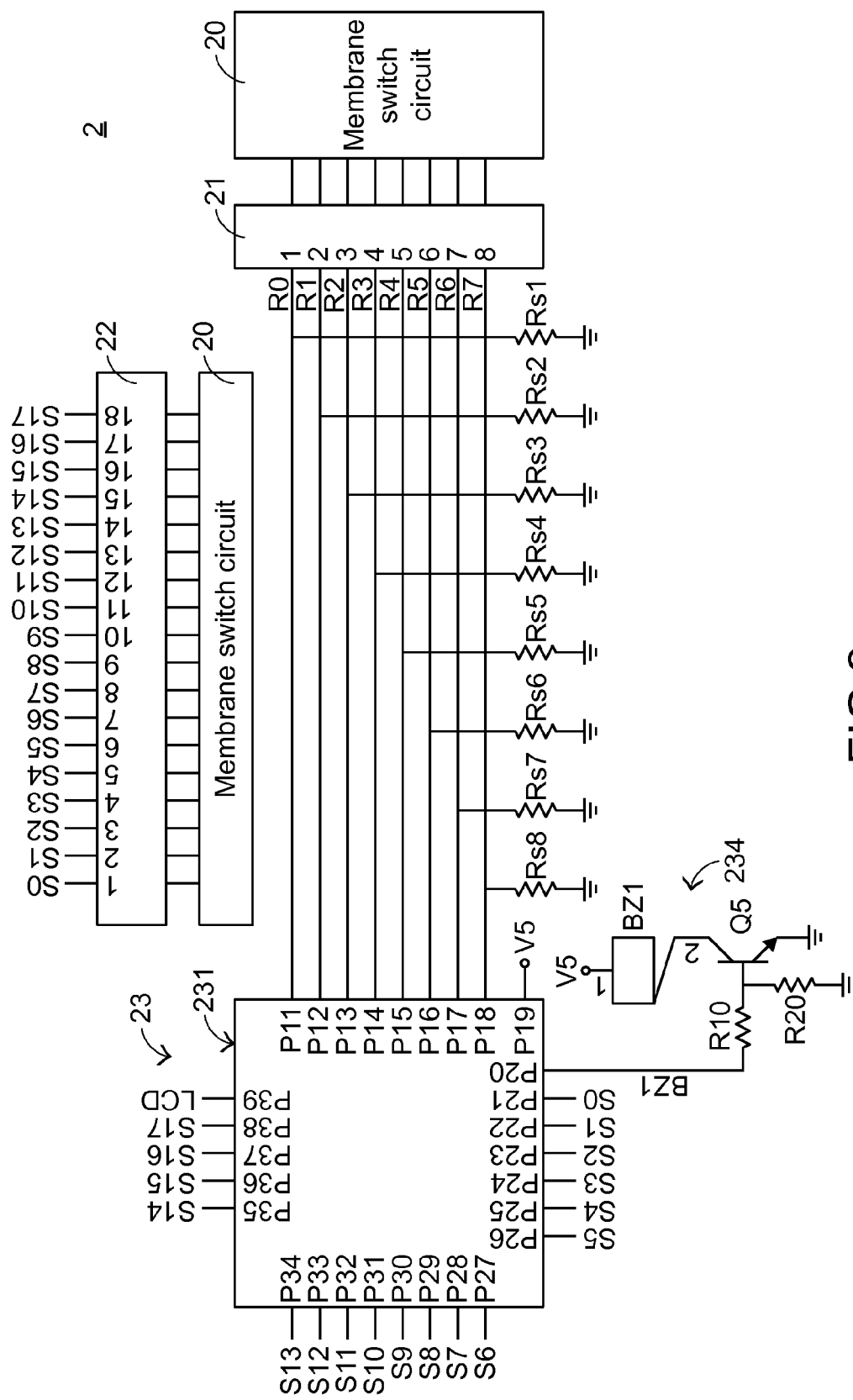
FIG. 2 is a schematic circuit diagram illustrating a membrane switch circuit testing system according to a first embodiment of the present invention.
Figure 3:
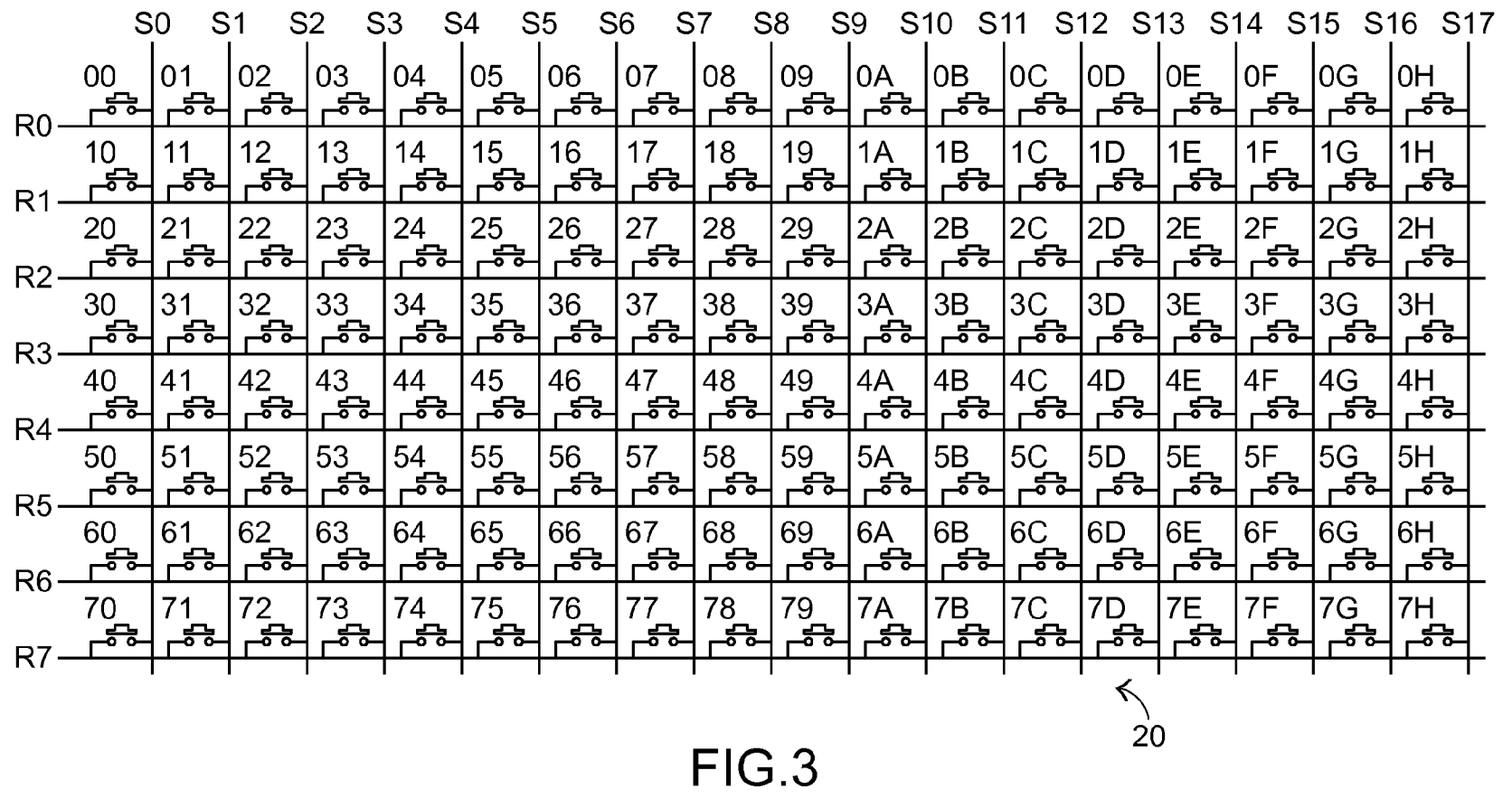

FIG. 2 is a schematic circuit diagram illustrating a membrane switch circuit testing system according to a first embodiment of the present invention. FIG. 3 is a schematic circuit diagram illustrating plural key intersections of the membrane switch circuit to be tested by the membrane switch circuit testing system according to the first embodiment of the present invention. Please refer to FIGS. 2 and 3. The membrane switch circuit testing system 2 is used for testing a membrane switch circuit 20. The membrane switch circuit 20 comprises plural scan input lines R0~R7, plural scan output lines S0~S17 and plural key intersections RL (see FIG. 5). The plural key intersections RL are defined by the plural scan input lines R0~R7 and the plural scan output lines S0~S17 collaboratively. Moreover, the key intersections have respective identification codes 00, 01, . . . , 10, 11, . . . , 70, . . . , and 7H. When one of the key intersections is depressed, the key intersection is electrically conducted to generate an intersection resistance value. The structure of the membrane switch circuit 20 is similar to that of FIG. 1, and is not redundantly described herein.

Please refer to FIGS. 2 and 3 again. The membrane switch circuit testing system 2 comprises a first connection element 21, a second connection element 22, and a testing module 23. The first connection element 21 is connected with the plural scan input lines R0~R7 of the under-test membrane switch circuit 20. The second connection element 22 is connected with the plural scan output lines S0~S17 of the membrane switch circuit 20. The testing module 23 is connected with the first connection element 21 and the second connection element 22. The testing module 23 is used for testing the plural intersection resistance values corresponding to the plural key intersections RL of the membrane switch circuit 20. In this embodiment, the first connection element 21 and the second connection element 22 are fixtures for fixing the plural scan input lines R0~R7 and the plural scan output lines S0~S17.

Figure 4:
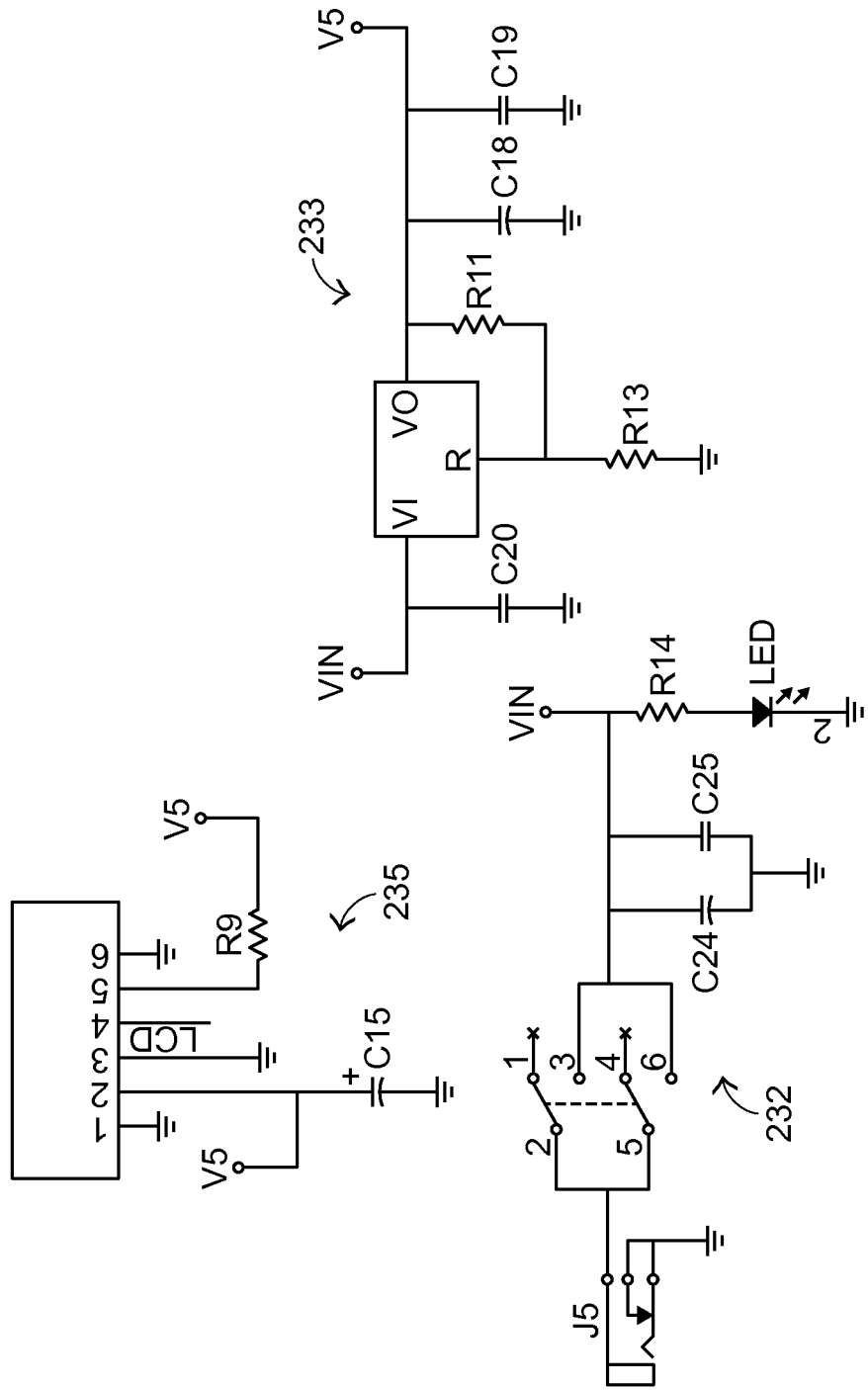
FIG. 4 is a schematic circuit diagram illustrating a switching circuit, a voltage regulating circuit and a display unit of the membrane switch circuit testing system according to the first embodiment of the present invention.

Hereinafter, the internal circuitry of the testing module 23 will be illustrated with reference to FIGS. 2 and 4. FIG. 4 is a schematic circuit diagram illustrating a switching circuit, a voltage regulating circuit and a display unit of the membrane switch circuit testing system according to the first embodiment of the present invention. The testing module 23 comprises a control unit 231, plural fixed resistors Rs1~Rs8, a switching circuit 232, a voltage regulating circuit 233, a warning unit 234, and a display unit 235. The control unit 231 has a default resistance value. The control unit 231 has two main functions. In accordance with the first function, the control unit 231 may compare the intersection resistance value of the depressed key intersection RL with the default resistance value, thereby judging whether the depressed key intersection RL passes the test (also referred as "qualified") or fails to pass the test (also referred as "unqualified"). In accordance with the second function, the control unit 231 assigns the plural identification codes 00~7H to the plural key intersections RL, so that each key intersection RL has a corresponding identification code. The control unit 231 comprises plural first connecting pins P11~P19 and plural second connecting pins P20~P39. The first connecting pins P11~P18 correspond to the plural scan input lines R0~R7, respectively. The first connecting pin P11 corresponds to the scan input line R0. The first connecting pin P12 corresponds to the scan input line R1. The rest may be deduced by analogy. Moreover, the first connecting pins P11~P18 are connected with the plural scan input lines R0~R7, respectively. The first connecting pin P19 is connected with the voltage regulating circuit 233. The second connecting pins P21~P38 correspond to the plural scan output lines S0~S17, respectively. The second connecting pin P21 corresponds to the scan output line S0. The second connecting pin P22 corresponds to the scan output line S1. The rest may be deduced by analogy. Moreover, the second connecting pins P21~P38 are connected with the plural scan output lines S0~S17, respectively. The second connecting pin P20 is connected with the warning unit 234. The second connecting pin P39 is connected with the display unit 235.

The plural fixed resistors Rs1~Rs8 of the testing module 23 are connected with the plural scan input lines R0~R7 and the plural first connecting pins P11~P18, respectively. The switching circuit 232 is connected with a power source Vin for receiving electric power from the power source Vin. The voltage regulating circuit 233 is connected with the power source Vin and the first connecting pin P19 of the control unit 231. The voltage regulating circuit 233 is used for stabilizing the electric power in order to drive the control unit 231. The warning unit 234 is connected with the second connecting pin P20 of the control unit 231. If the control unit 231 judges that the depressed key intersection RL passes the test, the warning unit 234 generates a first warning sound. Whereas, if the control unit 231 judges that the depressed key intersection RL fails to pass the test, the warning unit 234 generates a second warning sound. The display unit 235 is connected with the second connecting pin P39 of the control unit 231. If the control unit 231 judges that the depressed key intersection RL passes the test, the identification code corresponding to the depressed key intersection RL and a pass test message are shown on the display unit 235. Whereas, if the control unit 231 judges that the depressed key intersection RL fails to pass the test, the identification code corresponding to the depressed key intersection RL and a failed test message are shown on the display unit 235.

In this embodiment, the control unit 231 is a microprocessor, the warning unit 234 is a buzzer, and the display unit 235 is a LCD display device. The pass test message and the failed test message are text messages. Moreover, the first warning sound is for example two short successive sounds, and the second warning sound is for example a long successive sound. It is noted that the types of the first warning sound and the second warning sound may be varied according to the usual practice or the preference of the tester.

The operations of assigning the plural identification codes 00~7H to the plural key intersections RL by the control unit 231 will be illustrated as follows. Before the testing module 23 starts to test the membrane switch circuit 20, the control unit 231 assigns plural first serial numbers 0~7 to the plural first connecting pins P11~P18, respectively. The first serial number 0 corresponds to the first connecting pin P11. The first serial number 1 corresponds to the first connecting pin P12. The rest may be deduced by analogy. On the other hand, the control unit 231 assigns plural second serial numbers 0~9 and A~H to the plural second connecting pins P21~P38, respectively. The second serial number 0 corresponds to the second connecting pin P21. The second serial number 1 corresponds to the second connecting pin P22. The second serial number A corresponds to the second connecting pin P30. The rest may be deduced by analogy. Consequently, the control unit 231 assigns the plural first serial numbers 0~7 and the plural second serial numbers 0~H as the identification codes of the plural key intersections RL.

For example, if the key intersection RL to be depressed is correlated with the Esc key of the keyboard device, the control unit 231 may assign the first serial number 0 and the second serial number 0 as the identification code of the key intersection RL corresponding to the scan input line R0 and the scan output line S0 (i.e. the key intersection RL corresponding to the Esc key). That is, the identification code of the key intersection RL corresponding to the Esc key is "00". Similarly, the identification code of the key intersection RL corresponding to the scan input line R7 and the scan output line S17 is "7H". In other words, each key intersection RL of the membrane switch circuit 20 has the corresponding identification code.

Figure 5:
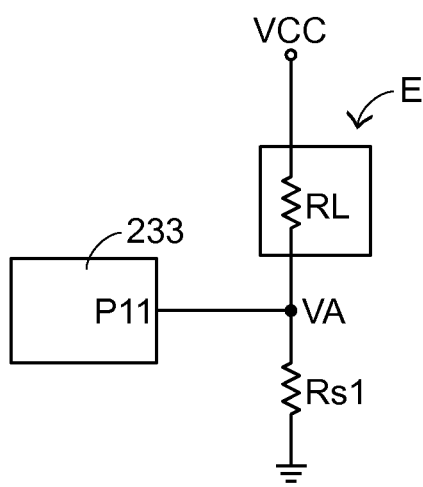
FIG. 5 is a schematic circuit diagram illustrating an equivalent circuit of the membrane switch circuit testing system according to the first embodiment of the present invention.

Hereinafter, the operations of the membrane switch circuit testing system 2 will be illustrated with reference to FIGS. 2, 3 and 4. After the membrane switch circuit 20 is connected with the testing module 23 through the first connection element 21 and the second connection element 22, the switching circuit 232 is turned on. Consequently, the electric power provided by the power source Vin is transmitted to the voltage regulating circuit 233 and stabilized by the voltage regulating circuit 233. The stabilized electric power is transmitted to the control unit 231 so as to drive the control unit 231. When the first key intersection RL of the membrane switch circuit 20 (e.g. the key intersection RL corresponding to the Esc key of the keyboard device and corresponding to the scan input line R0 and the scan output line S0) is depressed by the tester, the depressed key intersection RL is electrically conducted. Under this circumstance, the depressed key intersection RL and the fixed resistor Rs1 corresponding to the scan input line R0 are connected with each other in series, so that an equivalent circuit E as shown in FIG. 5 is defined. Meanwhile, the depressed key intersection RL generates an intersection resistance value. Through the first connecting pin P11 corresponding to the scan input line R0, the control unit 231 acquires the intersection resistance value. Moreover, by comparing the intersection resistance value with the default resistance value (e.g. 300 ohm), the control unit 231 judges whether the depressed key intersection RL passes the test or not.

If the key intersection RL is not electrically conducted, the scan input line R0 corresponding to the key intersection RL issues a first logic level signal to the control unit 231 through the first connecting pin P11, and the scan output line S0 corresponding to the key intersection RL also issues the first logic level signal to the control unit 231 through the second connecting pin 21. For example, the first logic level signal is a low logic level signal. On the other hand, if the key intersection RL is electrically conducted, the scan input line R0 corresponding to the key intersection RL issues a second logic level signal to the control unit 231 through the first connecting pin P11, and the scan output line S0 corresponding to the key intersection RL also issues the second logic level signal to the control unit 231 through the second connecting pin 21. For example, the second logic level signal is a high logic level signal. When the high logic level signal is received by the control unit 231, the first serial number 0 of the first connecting pin P11 outputting the high logic level signal and the second serial number 0 of the second connecting pin 21 outputting the high logic level signal are acquired by the control unit 231. Under this circumstance, the identification code "00" of the depressed key intersection RL is acquired.

Moreover, a formula for calculating the intersection resistance value corresponding to the key intersection RL is previously stored in the control unit 231. The formula is expressed as: the intersection resistance value=the resistance value of the fixed resistor Rs1×(the test voltage VCC−the real voltage value VA)/the real voltage value VA. The above formula is obtained according to the equivalent circuit E and Ohm's law. The test voltage VCC is provided by the voltage regulating circuit 233. Since the resistance value of the fixed resistor Rs1 in the equivalent circuit E is known, the control unit 231 may acquire the intersection resistance value of the depressed key intersection RL according to the above formula.

After the intersection resistance value is acquired, if the intersection resistance value is lower than or equal to the default resistance value, the control unit 231 judges that the depressed key intersection RL passes the test. Meanwhile, a first signal (not shown) indicating the qualified key intersection RL is transmitted from the control unit 231 to the warning unit 234 through the second connecting pin P20. In response to the first signal, the warning unit 234 generates the first warning sound to notify the user that the depressed key intersection RL passes the test. Moreover, the information about the identification code 00 corresponding to the qualified depressed key intersection RL, the intersection resistance value and the pass test message (e.g. "00 250Ω PASS") is outputted from the control unit 231 through the second connecting pin P39.

On the other hand, if the intersection resistance value is higher than the default resistance value, the control unit 231 judges that the depressed key intersection RL fails to pass the test. Meanwhile, a second signal (not shown) indicating the unqualified key intersection RL is transmitted from the control unit 231 to the warning unit 234 through the second connecting pin P20. In response to the second signal, the warning unit 234 generates the second warning sound to notify the user that the depressed key intersection RL fails to pass the test. Moreover, the information about the identification code 00 corresponding to the unqualified depressed key intersection RL, the intersection resistance value and the failed test message (e.g. "00 330Ω FAIL") is outputted from the control unit 231 through the second connecting pin P39.

The testing procedures of the remaining key intersections RL are similar to the above testing procedure, and are not redundantly described herein. Moreover, according to the identification code 00 of the key intersection RL and the failed test message shown on the display unit 235, the tester may realize which key intersection RL is not qualified. Consequently, the membrane switch circuit 20 may be returned to the factory to be repaired or corrected. After the membrane switch circuit 20 is repaired or corrected, the above testing procedures are repeatedly done until all key intersections RL pass the test. After the procedures of all key intersections RL are completed, the testing method of testing the membrane switch circuit 20 is completed.

The following two aspects should be specially described. Firstly, the tester may manually and sequentially depress all key intersections RL of the membrane switch circuit 20 in order to test the key intersections RL. However, the way of testing the key intersections RL is not restricted. Alternatively, an automatic knocking tool may be used in the membrane switch circuit testing system of the present invention in order to enhance the testing efficiency and the touch accuracy. Secondly, the use of the warning unit is only to prompt the tester. It is noted that the warning unit is not the essential component of the membrane switch circuit testing system of the present invention.

Figure 6:
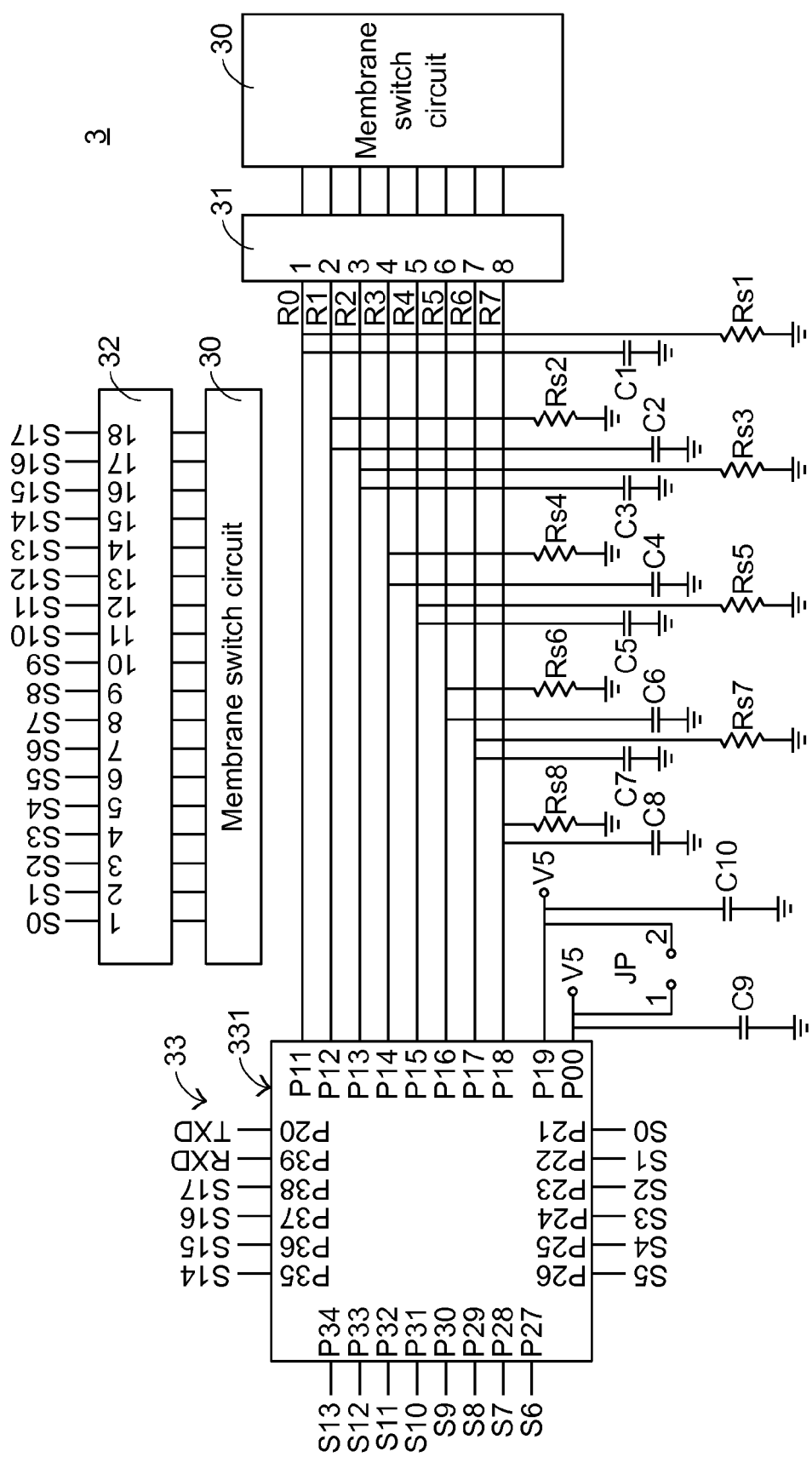
FIG. 6 is a schematic circuit diagram illustrating a membrane switch circuit testing system according to a second embodiment of the present invention.
Figure 7:
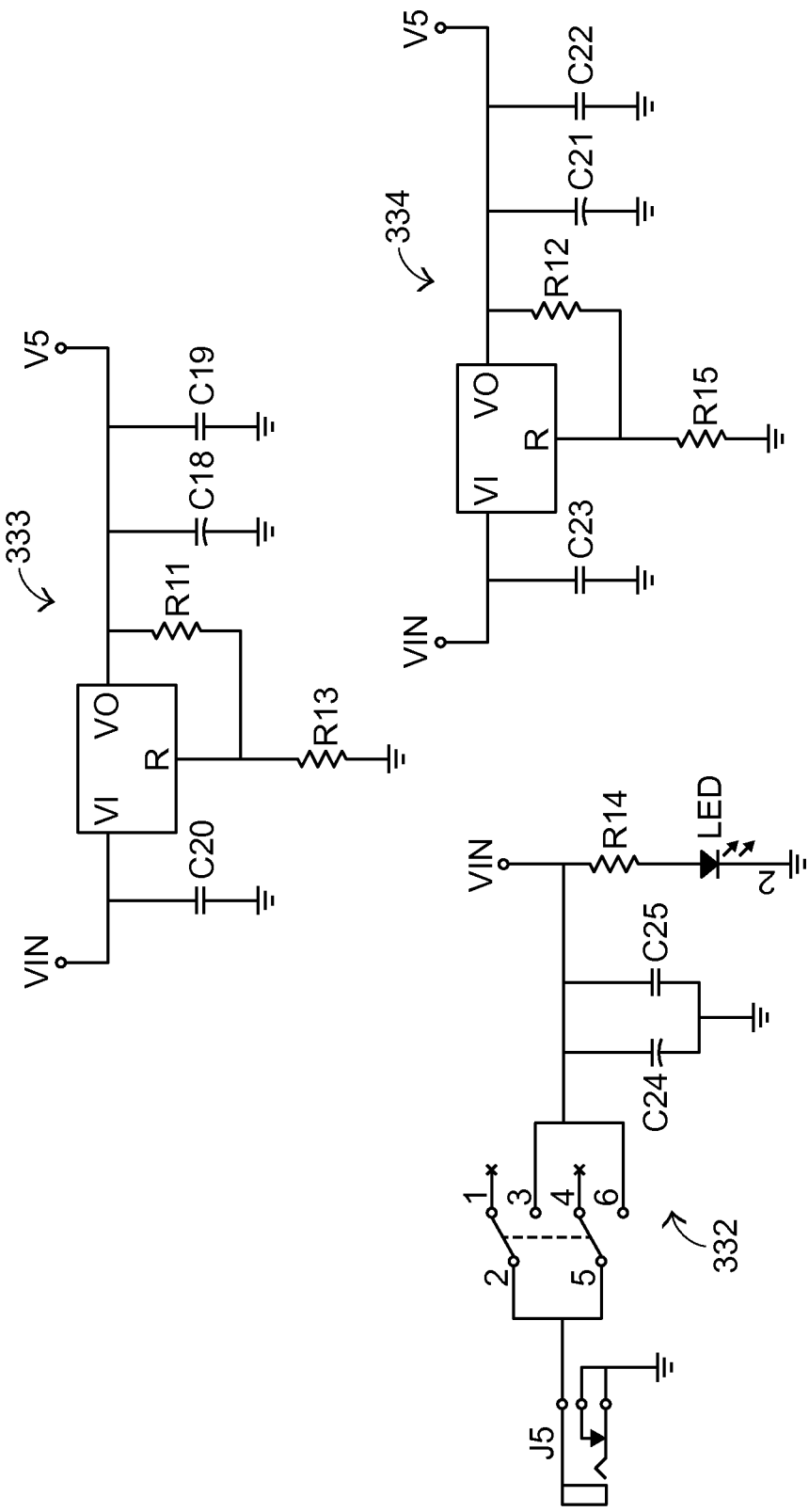
FIG. 7 is a schematic circuit diagram illustrating a switching circuit and a voltage regulating circuit of the membrane switch circuit testing system according to the second embodiment of the present invention.
Figure 8:
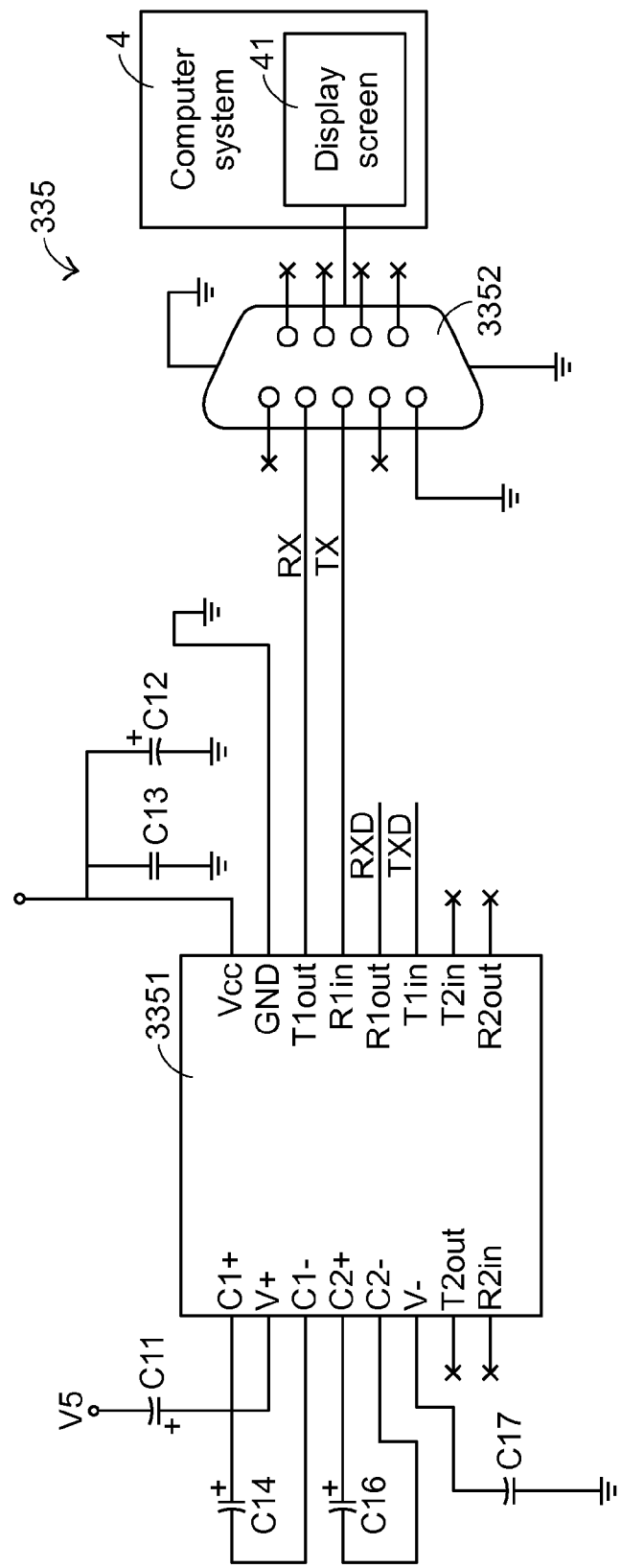
FIG. 8 is a schematic circuit diagram illustrating a connecting circuit of the membrane switch circuit testing system according to the second embodiment of the present invention.

The present invention further provides a second embodiment, which is distinguished from the first embodiment. FIG. 6 is a schematic circuit diagram illustrating a membrane switch circuit testing system according to a second embodiment of the present invention. FIG. 7 is a schematic circuit diagram illustrating a switching circuit and a voltage regulating circuit of the membrane switch circuit testing system according to the second embodiment of the present invention. FIG. 8 is a schematic circuit diagram illustrating a connecting circuit of the membrane switch circuit testing system according to the second embodiment of the present invention. Please refer to FIGS. 6, 7 and 8. The membrane switch circuit testing system 3 is used for testing a membrane switch circuit 30. The membrane switch circuit 30 comprises plural scan input lines R0~R7, plural scan output lines S0~S17 and plural key intersections RL. The plural key intersections RL are defined by the plural scan input lines R0~R7 and the plural scan output lines S0~S17 collaboratively. The membrane switch circuit testing system 3 comprises a first connection element 31, a second connection element 32, and a testing module 33. The testing module 33 comprises a first control unit 331, plural fixed resistors Rs1~Rs8, plural capacitors C1~C10, a switching circuit 332, a first voltage regulating circuit 333, a second voltage regulating circuit 334, and a connecting circuit 335. The first control unit 331 comprises plural first connecting pins P00~P19 and plural second connecting pins P20~P39.

Except for the following four aspects, the configurations of the membrane switch circuit testing system 3 of this embodiment are substantially identical to those of the membrane switch circuit testing system 2 of the first embodiment. The identical aspects are not redundantly described herein. In the first distinguished aspect, the first control unit 331 further comprises the first connecting pin P00. In the second distinguished aspect, the testing module 33 further comprises the plural capacitors C1~C10. In the third distinguished aspect, the testing module 33 comprises the second voltage regulating circuit 334 in addition to the first voltage regulating circuit 333. In the fourth distinguished aspect, the testing module 33 further comprises the connecting circuit 335. Through the connecting circuit 335, the communication between the testing module 33 and a computer system 4 is established.

The distinguished aspects will be illustrated in more details as follows. Please refer to FIG. 6. The capacitors C1~C8 correspond to the fixed resistors Rs1~Rs8 and the first connecting pins P11~P18, respectively. The capacitor C1 corresponds to the fixed resistor Rs1. The capacitor C2 corresponds to the fixed resistor Rs2. The rest may be deduced by analogy. Moreover, the capacitors C1~C8 are connected with the first connecting pins P11~P18 and the fixed resistors Rs1~Rs8, respectively. The capacitor C9 is connected with the first connecting pin P00 and the first voltage regulating circuit 333. The capacitor C10 is connected with the first connecting pin P19 and the second voltage regulating circuit 334. The plural capacitors C1~C10 are used for filtering off noise.

As mentioned above, the first voltage regulating circuit 333 is connected with the first control unit 331 through the first connecting pin P00, and the second voltage regulating circuit 334 is connected with the first control unit 331 through the first connecting pin P19. Since the membrane switch circuit testing system 3 of this embodiment additionally comprises the second voltage regulating circuit 334, the efficacy of stabilizing the electric power is enhanced. Moreover, the first voltage regulating circuit 333 and the second voltage regulating circuit 334 may be connected with each other through a jumper wire JP. Under this circumstance, the supply voltage V5 is shared by the first voltage regulating circuit 333 and the second voltage regulating circuit 334, and the second voltage regulating circuit 334 is not necessarily connected to an additional supply voltage.

Hereinafter, the detailed configurations of the connecting circuit 335 will be illustrated with reference to FIG. 8. The connecting circuit 335 comprises a second control unit 3351 and a connector 3352. The second control unit 3351 is connected with the first control unit 331 through the second connecting pins P20 and P39. Consequently, the second control unit 3351 may receive various signals and the plural identification codes of the key intersections from the first control unit 331. The connector 3352 is connected with the second control unit 3351 and the computer system 4. The signals and the plural identification codes of the key intersections are transmitted to the computer system 4 through the connector 3352. In this embodiment, the connector 3352 is a RS232 connector. It is noted that the type of the connector 3352 is not restricted. Alternatively, the connector 3352 may be a USB connector or a Mini USB connector.

Hereinafter, the operations of the membrane switch circuit testing system 3 will be illustrated with reference to FIGS. 6, 7 and 8. After the membrane switch circuit 30 is connected with the testing module 33 through the first connection element 31 and the second connection element 32, the switching circuit 332 is turned on. Consequently, the electric power provided by the power source Vin is transmitted to the first voltage regulating circuit 333 and the second voltage regulating circuit 334 to be stabilized. The stabilized electric power is transmitted to the first control unit 331 so as to drive the first control unit 331. When the key intersection RL of the membrane switch circuit 30 corresponding to the scan input line R7 and the scan output line S17 is depressed by the tester manually or by an automatic knocking tool, the depressed key intersection RL is electrically conducted. Under this circumstance, the depressed key intersection RL and the fixed resistor Rs8 corresponding to the scan input line R7 are connected with each other in series, so that an equivalent circuit (not shown) is defined. Meanwhile, the depressed key intersection RL generates an intersection resistance value. Through the first connecting pin P18 corresponding to the scan input line R7, the first control unit 331 acquires the intersection resistance value. Moreover, by comparing the intersection resistance value with the default resistance value (e.g. 300 ohm), the first control unit 331 judges whether the depressed key intersection RL passes the test or not.

If the key intersection RL is electrically conducted, the logic level signal outputted from the scan input line R7 corresponding to the key intersection RL through the first connecting pin P18 is switched from a first logic level signal to a second logic level signal, and the logic level signal outputted from the scan output line S17 corresponding to the key intersection RL through the second connecting pin 38 is also switched from the first logic level signal to the second logic level signal. Consequently, the second logic level signals from the first connecting pin P18 and the second connecting pin 38 are received by the first control unit 331. Meanwhile, the first serial number 7 of the first connecting pin P18 outputting the second logic level signal and the second serial number H of the second connecting pin 38 outputting the second logic level signal are acquired by the first control unit 331. Under this circumstance, the identification code "7H" of the depressed key intersection RL is acquired. Moreover, the first control unit 331 may acquire the intersection resistance value of the depressed key intersection RL according to the above formula.

After the intersection resistance value is acquired, if the intersection resistance value is lower than or equal to the default resistance value, the first control unit 331 judges that the depressed key intersection RL passes the test. Meanwhile, the information about the identification code 7H corresponding to the depressed key intersection RL, the intersection resistance value and the pass test message is outputted from the first control unit 331 to the computer system 4 through the second connecting pins P20 and P39 and the connecting circuit 335. Consequently, the information about the identification code 7H corresponding to the depressed key intersection RL, the intersection resistance value and the pass test message (e.g. "7H 275Ω PASS") is shown on a display screen 41 of the computer system 4.

On the other hand, if the intersection resistance value is higher than the default resistance value, the first control unit 331 judges that the depressed key intersection RL fails to pass the test. Meanwhile, the information about the identification code 7H corresponding to the depressed key intersection RL, the intersection resistance value and the failed test message is outputted from the first control unit 331 to the computer system 4 through the second connecting pins P20 and P39 and the connecting circuit 335. Consequently, the information about the identification code 7H corresponding to the depressed key intersection RL, the intersection resistance value and the failed test message (e.g. "7H 350Ω FAIL") is shown on the display screen 41 of the computer system 4.

The testing procedures of the remaining key intersections RL are similar to the above testing procedure, and are not redundantly described herein.

It is preferred that an analyzing program may be previously installed in the computer system 4. According to the received identification code, the intersection resistance value and the pass test message (or the failed test message), the analyzing program may output a test result report. Moreover, the identification code corresponding to the failed test may be specially marked in the test result report. According to the test result report, the tester may realize which key intersections fail to pass the test, and thus the tester may further repair and correct the membrane switch circuit.

From the above descriptions, the present invention provides a membrane switch circuit testing system. In the membrane switch circuit testing system, a control unit may assign first serial numbers and second serial numbers to corresponding first connecting pins and corresponding second connecting pins in order to assign corresponding identification codes to plural key intersections. When one of the plural key intersections is depressed to be tested, the control unit may realize which key intersection is depressed according to the first serial number and the second serial number corresponding to the first connecting pin and the second connecting pin of the depressed key intersection. Then, since the key intersection is electrically conducted and an equivalent circuit is defined, the control unit may acquire the intersection resistance value from the equivalent circuit. Moreover, by comparing the intersection resistance value with the default resistance value, the control unit judges whether the depressed key intersection passes the test or not. Afterwards, the test result is shown on the display unit or the display screen of the computer system. By viewing the test result, the tester may perform the subsequent task.

In comparison with the conventional testing method, the membrane switch circuit testing system of the present invention can recognize the depressed key intersection. During the testing process, it is not necessary for the tester to successively record the sequence of depressing the key intersection or record the current depressed key intersection. Under this circumstance, the erroneous judgment is avoided, and the testing accuracy is enhanced. Moreover, the membrane switch circuit testing system of the present invention may be in communication with and in cooperation with a computer system. Alternatively, the membrane switch circuit testing system of the present invention may be individually operated without being in communication with the computer system. In other word, the membrane switch circuit testing system may be selectively operated in different operation mode.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A membrane switch circuit testing system for testing a membrane switch circuit, the membrane switch circuit comprising plural scan input lines, plural scan output lines and plural key intersections, the plural key intersections being defined by the plural scan input lines and the plural scan output lines collaboratively, at least one key intersection of the plural key intersections generating an intersection resistance value when electrically conducted, the membrane switch circuit testing system comprising:

a connection element connected with the membrane switch circuit; and a testing module connected with the connection element, and testing the plural intersection resistance values corresponding to the plural key intersections of the membrane switch circuit, wherein the testing module comprises:

a control unit having a default resistance value, wherein the control unit recognizes the at least one key intersection, or the control unit judging whether the key intersection is qualified according to the intersection resistance value and the default resistance value, wherein the control unit comprises plural first connecting pins corresponding to respective scan input lines and plural second connecting pins corresponding to respective scan output lines, wherein the plural first connecting pins are connected with respective scan input lines, and the plural second connecting pins are connected with respective scan output lines; and plural fixed resistors corresponding to respective scan input lines and connected with respective first connecting pins, wherein when one of the plural key intersections is depressed, an equivalent circuit is defined by the depressed key intersection and the corresponding fixed resistor, wherein the control unit acquires the corresponding intersection resistance value from the equivalent circuit, thereby judging whether the depressed key intersection is qualified.

2. The membrane switch circuit testing system according to claim 1, wherein when the key intersection is depressed, the depressed key intersection and the corresponding fixed resistor are connected with each other in series to define the equivalent circuit, wherein the control unit acquires the corresponding intersection resistance value through the corresponding first connecting pin from the equivalent circuit, and the control unit compares the intersection resistance value with the default resistance value, thereby judging whether the depressed key intersection is qualified, wherein if the intersection resistance value is lower than or equal to the default resistance value, the control unit judges that the depressed key intersection is qualified, wherein if the intersection resistance value is higher than the default resistance value, the control unit judges that the depressed key intersection is unqualified.

3. The membrane switch circuit testing system according to claim 1, wherein the testing module further comprises a warning unit, and the warning unit is connected with the control unit, wherein if the control unit judges that the depressed key intersection is qualified, the warning unit generates a first warning sound, wherein if the control unit judges that the depressed key intersection is unqualified, the warning unit generates a second warning sound.

4. The membrane switch circuit testing system according to claim 1, wherein the testing module further comprises a display unit, and the display unit is connected with the control unit, wherein if the control unit judges that the depressed key intersection is qualified, a pass test message corresponding to the depressed key intersection is shown on the display unit, wherein if the control unit judges that the depressed key intersection is unqualified, a failed test message corresponding to the depressed key intersection is shown on the display unit.

5. The membrane switch circuit testing system according to claim 1, wherein the control unit assigns plural first serial numbers to the plural first connecting pins and assigns plural second serial numbers to the plural second connecting pins, wherein the control unit further assigns the plural first serial numbers and the plural second serial numbers as plural identification codes of the plural key intersections, and recognizes the plural key sections according to the plural identification codes.

6. The membrane switch circuit testing system according to claim 5, wherein if all of the plural key intersections are not electrically conducted, the plural scan input lines issue a first logic level signal to the control unit through the plural first connecting pins, and the plural scan output lines issue the first logic level signal to the control unit through the second connecting pins, wherein if one of the plural key intersections is depressed, the scan input line corresponding to the depressed key intersection issues a second logic level signal to the control unit through the corresponding first connecting pin, and the scan output line corresponding to the depressed key intersection also issues the second logic level signal to the control unit through the corresponding second connecting pin, wherein the control unit acquires the identification code corresponding to the depressed key intersection according to the first serial number of the scan input line corresponding to the depressed key intersection and the second serial number of the scan output line corresponding to the depressed key intersection.

7. The membrane switch circuit testing system according to claim 6, wherein the testing module further comprises a display unit, and the display unit is connected with the control unit, wherein if the control unit judges that the depressed key intersection is qualified, the identification code corresponding to the depressed key intersection, the intersection resistance value and a pass test message are shown on the display unit, wherein if the control unit judges that the depressed key intersection is unqualified, the identification code corresponding to the depressed key intersection, the intersection resistance value and a failed test message are shown on the display unit.

8. The membrane switch circuit testing system according to claim 6, wherein the testing module further comprises a connecting circuit, and the connecting circuit is connected with the control unit and a computer system, so that the testing module and the computer system are in communication with each other through the connecting circuit, wherein if the control unit judges that the depressed key intersection is qualified, the identification code corresponding to the depressed key intersection, the intersection resistance value and a pass test message are shown on a display screen of the computer system, wherein if the control unit judges that the depressed key intersection is unqualified, the identification code corresponding to the depressed key intersection, the intersection resistance value and a failed test message are shown on the display screen.

9. The membrane switch circuit testing system according to claim 1, wherein the testing module further comprises plural capacitors corresponding to the plural fixed resistors, respectively, wherein the plural capacitors are connected with the corresponding first connecting pins so as to filter off noise.

10. The membrane switch circuit testing system according to claim 1, wherein the testing module further comprises:

a switching circuit connected with a power source for receiving electric power from the power source; and a voltage regulating circuit connected with the power source and a specified first connecting pin of the plural first connecting pins, wherein the electric power is stabilized by the voltage regulating circuit.

* * * * *